(12) United States Patent
Tanaka et al.

(10) Patent No.: US 7,994,614 B2
(45) Date of Patent: Aug. 9, 2011

(54) SEMICONDUCTOR WAFER, SEMICONDUCTOR DEVICE, AND METHOD OF MANUFACTURING SEMICONDUCTOR DEVICE

(75) Inventors: Kouji Tanaka, Kanagawa (JP); Seiya Isozaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 57 days.

(21) Appl. No.: 12/382,540

(22) Filed: Mar. 18, 2009

(65) Prior Publication Data

US 2009/0243044 A1     Oct. 1, 2009

(30) Foreign Application Priority Data

Mar. 28, 2008 (JP) ................. 2008-085576

(51) Int. Cl.
*H01L 29/06* (2006.01)
(52) U.S. Cl. ......... 257/622; 257/618; 257/623; 257/797
(58) Field of Classification Search .................. 257/618, 257/622, 623, 797
See application file for complete search history.

(56) References Cited

U.S. PATENT DOCUMENTS

| | | |
|---|---|---|
| 2006/0103025 A1 | 5/2006 | Furusawa et al. |
| 2008/0174023 A1* | 7/2008 | Park ................ 257/773 |

FOREIGN PATENT DOCUMENTS

| | | |
|---|---|---|
| JP | 2006-108489 | 4/2006 |
| JP | 2006-140404 | 6/2006 |
| JP | 2006-203215 | 8/2006 |

* cited by examiner

*Primary Examiner* — Long Pham
(74) *Attorney, Agent, or Firm* — McGinn Intellectual Property Law Group, PLLC (57) ABSTRACT

Provided is a semiconductor wafer with a scribe line region and a plurality of element forming regions partitioned by the scribe line region, the semiconductor wafer including: conductive patterns formed in the scribe line region; and an island-shaped passivation film formed above at least a conductive pattern, which is or may be exposed to a side surface of a semiconductor chip obtained by dicing the semiconductor wafer along the scribe line region, among the conductive patterns, so that the island-shaped passivation film is opposed to the conductive pattern.

15 Claims, 13 Drawing Sheets

PRIOR ART

SEMICONDUCTOR WAFER, SEMICONDUCTOR DEVICE, AND METHOD OF MANUFACTURING SEMICONDUCTOR DEVICE

BACKGROUND

1. Field of the Invention

The present invention relates to a semiconductor wafer and a semiconductor device. Further, the present invention relates to a method of manufacturing a semiconductor device.

2. Description of Related Art

Semiconductor wafers are partitioned into a plurality of element forming regions by a scribe line region. Semiconductor chips are obtained by dicing each semiconductor wafer along the scribe line region in an assembly and testing process. A dicing process is carried out by cutting the semiconductor wafer with a blade or the like. In this case, damage may occur in the scribe line region and the damage may spread to the element forming region.

If the damage spreads to the element forming region, the reliability of the semiconductor chip inevitably deteriorates. In view of this, a technique is proposed in which the deterioration in reliability of a semiconductor device due to the damage occurring in the scribe line region during the dicing process is suppressed.

Figure 12:
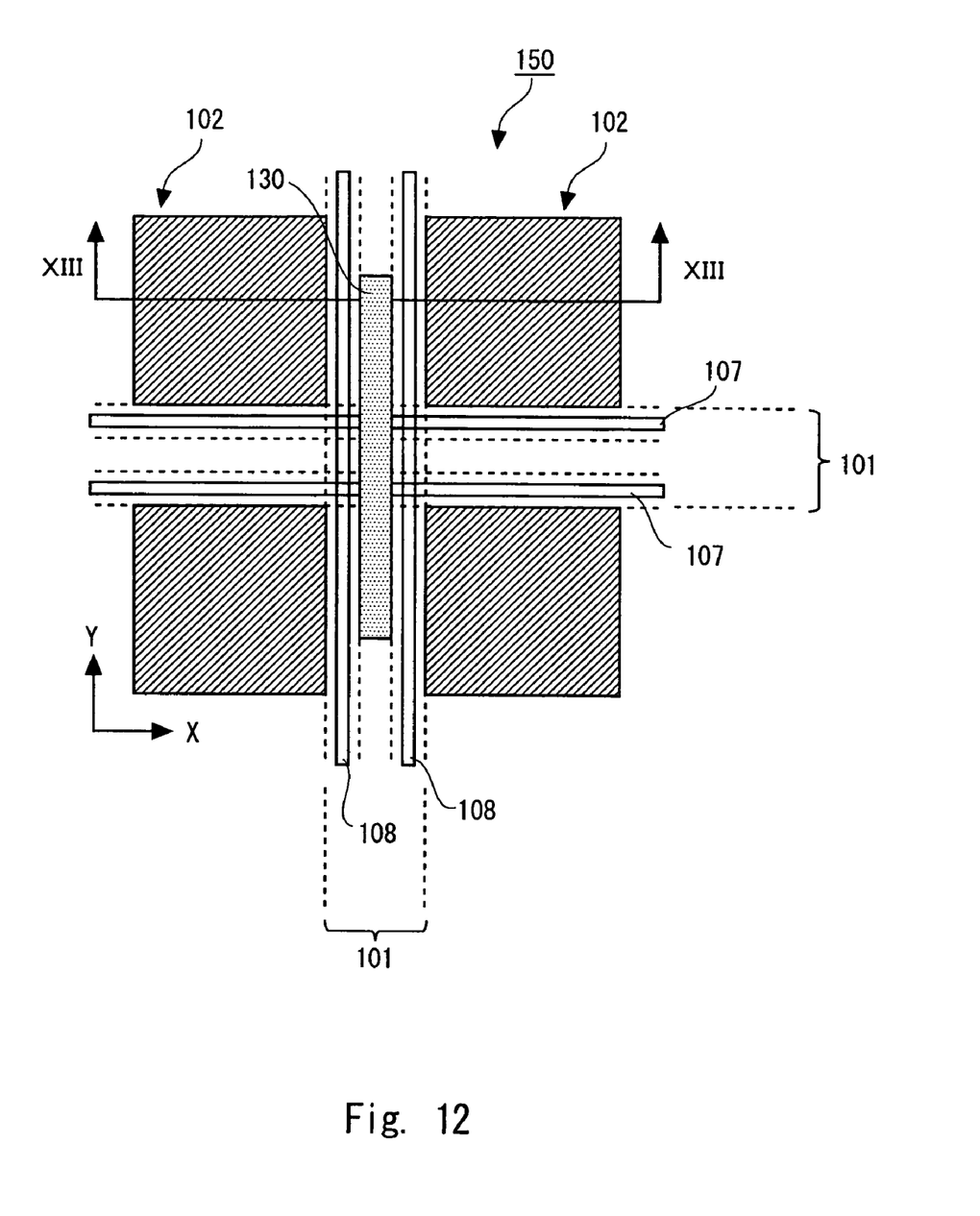
FIG. 12 is a partially enlarged plan view of a semiconductor wafer disclosed in Japanese Unexamined Patent Application Publication No. 2006-108489.
Figure 13:
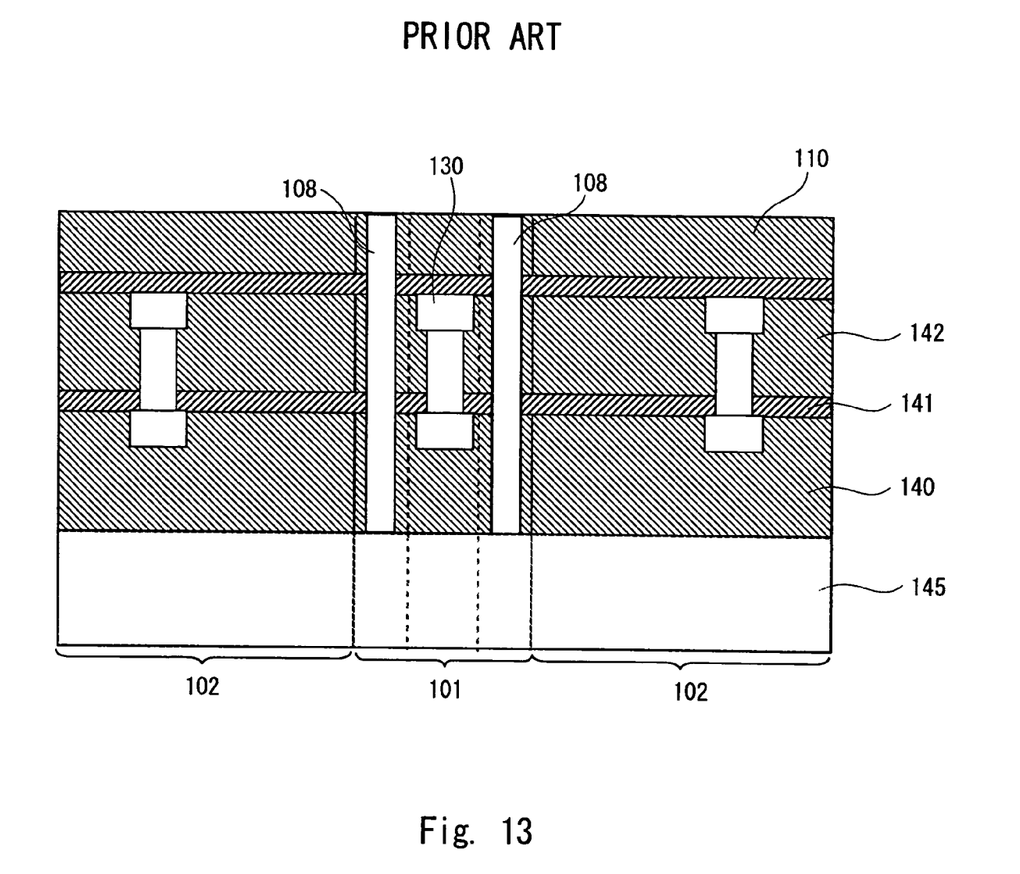
FIG. 13 is a cross-sectional view taken along the line XIII-XIII of FIG. 12.

FIG. 12 shows a partially enlarged plan view of a semiconductor wafer 150 disclosed in Japanese Unexamined Patent Application Publication No. 2006-108489. FIG. 13 shows a cross-sectional view taken along the line XIII-XIII of FIG. 12. As shown in FIG. 12, the semiconductor wafer 150 includes a plurality of rectangular semiconductor chip regions 102, and a scribe line region 101 surrounding the semiconductor chip regions 102. Further, the semiconductor wafer 150 includes a first interlayer insulating film 140, a diffusion preventing film 141, a low-dielectric-constant film 142, and a passivation film 110, which are stacked on a semiconductor substrate 145 (see FIG. 13).

Referring to FIG. 12, in the vicinity of a boundary with the semiconductor chip regions 102 in the scribe line region 101, endless trenches 107 and 108 are formed to surround the semiconductor chip regions 102. Referring to FIG. 13, the trenches 107 and 108 are isolation trenches that penetrate the films to reach the surface of the semiconductor substrate 145. Further, a metal pattern 130 of a pad for a test element group (TEG) is formed in a Y-axis direction of FIG. 12 in the scribe line region 101.

The semiconductor wafer 150 having the above structure is diced along the scribed line region 101 in an X-axis direction by using a blade device (not shown) so that the trench 107 formed in the X-axis direction is included on the side of the semiconductor chip regions. After that, the semiconductor wafer 150 is diced along the scribe line region 101 in the Y-axis direction so that the trench 108 formed in the Y-axis direction is included on the side of the semiconductor chip regions. Japanese Unexamined Patent Application Publication No. 2006-108489 discloses a technique capable of preventing the damage occurring during the dicing process from spreading to the semiconductor chip regions 102, by providing the trenches 107 and 108, each of which has a depth at which the surface of the semiconductor substrate 145 is exposed, in the vicinity of the semiconductor chip regions 102.

Figure 14:
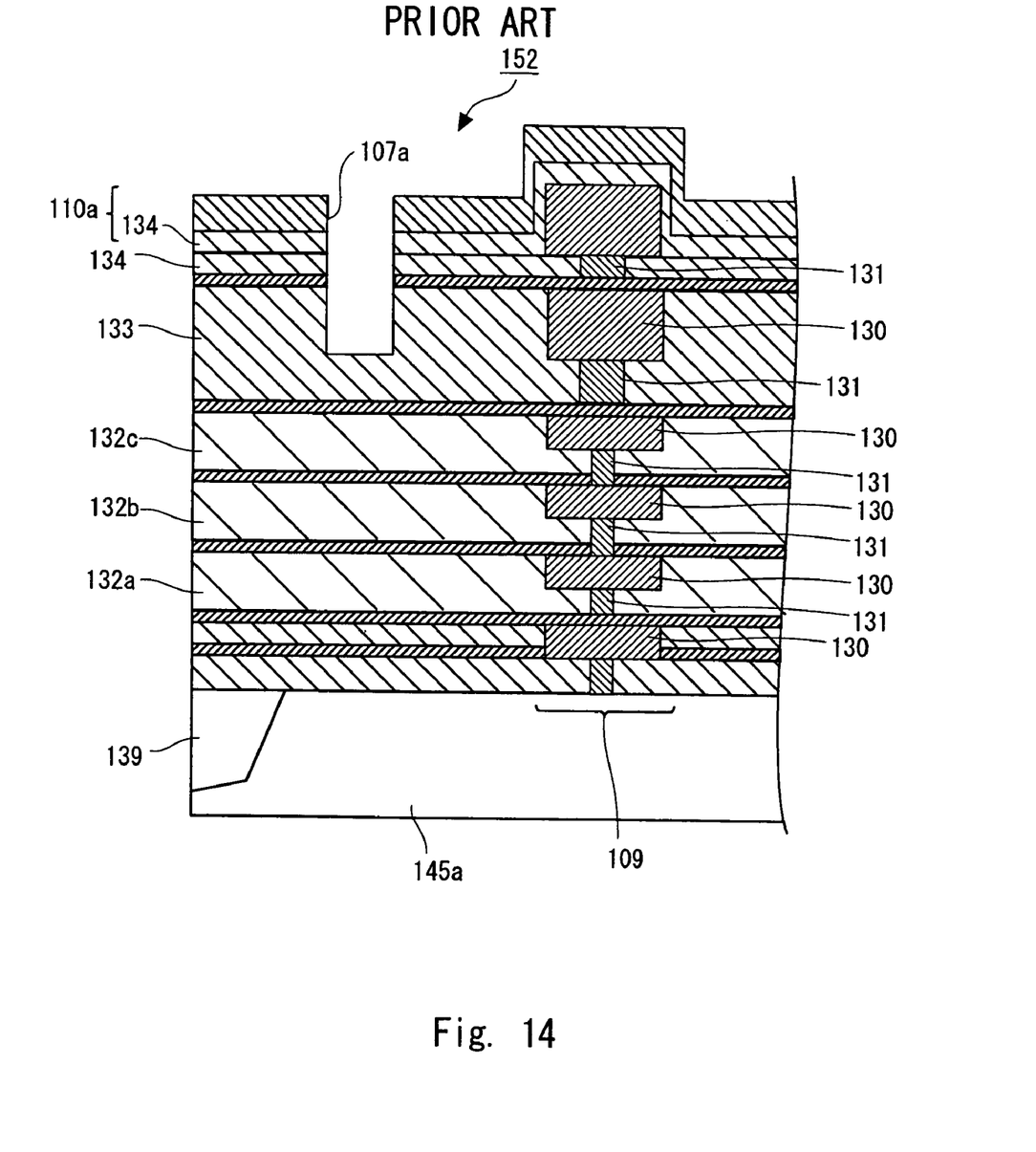
FIG. 14 is a partially enlarged cross-sectional view of a semiconductor device disclosed in Japanese Unexamined Patent Application Publication No. 2006-140404.

FIG. 14 is a partially enlarged cross-sectional view of a semiconductor device disclosed in Japanese Unexamined Patent Application Publication No. 2006-140404. A semiconductor device 152 includes a copper interconnection 130, an interlayer connection portion 131, low-dielectric-constant films 132a to 132c, silicon oxide films 133 and 134, a surface protection film 110a, a sealing ring 109, and a trench portion 107a.

Referring to FIG. 14, the trench portion 107a is formed so that a region in which the silicon oxide film 133 is reduced in thickness is formed outside the sealing ring 109. Japanese Unexamined Patent Application Publication No. 2006-140404 discloses a technique capable of preventing peeling due to the damage occurring during the dicing process from spreading to the sealing ring 109 even when a chipping 139 occurs at an end face of the silicon substrate 145a due to a mechanical strength applied during the dicing process.

Figure 15:
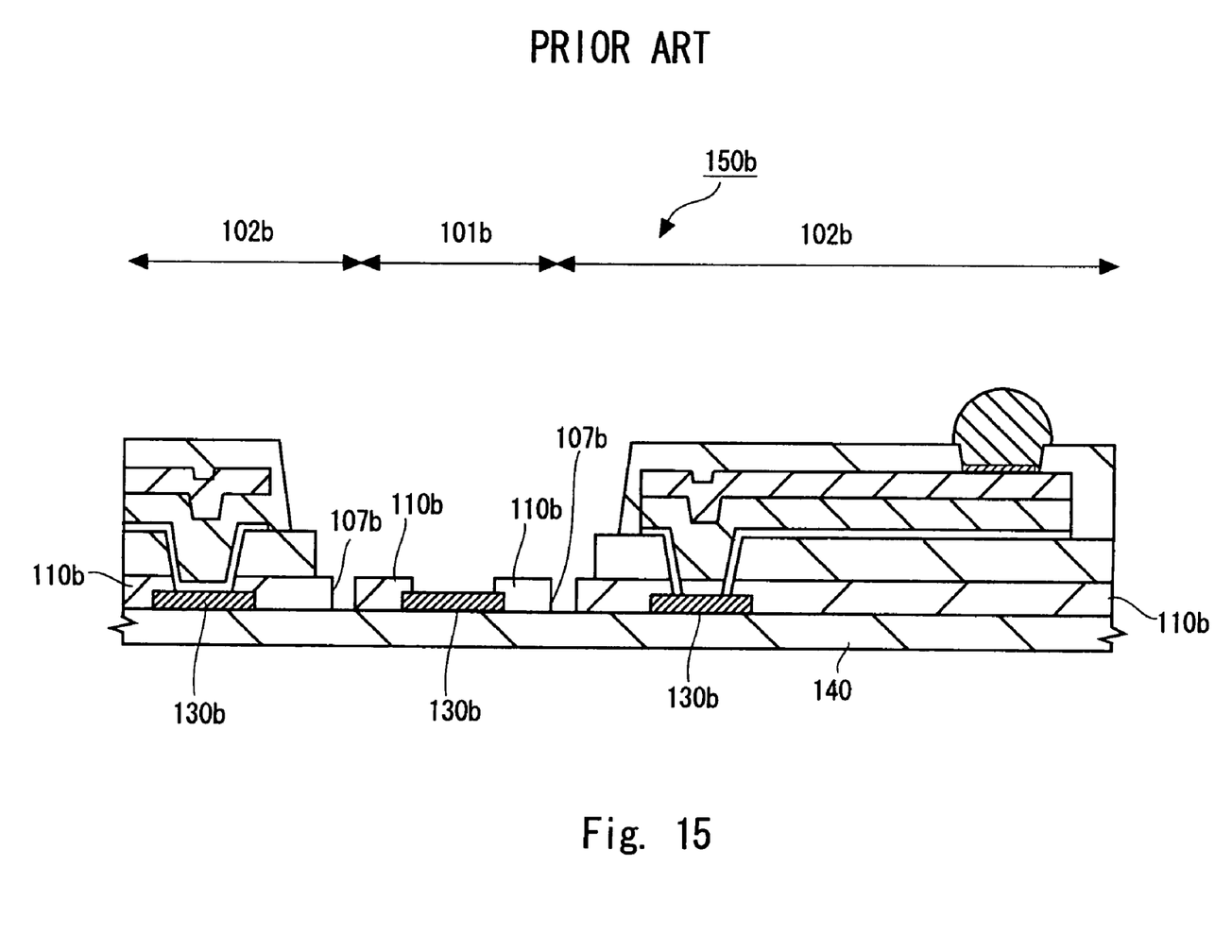
FIG. 15 is a cross-sectional view showing a main part of a semiconductor wafer having not been diced yet as disclosed in Japanese Unexamined Patent Application Publication No. 2006-203215.

Japanese Unexamined Patent Application Publication No. 2006-203215 does not disclose the technique of preventing the damage occurring in the scribe line region during the dicing process, but discloses a structure in which openings are formed in a passivation film at both ends of a scribe line region, that is, at a boundary with a chip region so as to surround the chip region. FIG. 15 is a cross-sectional view showing a main part of a semiconductor integrated circuit device (semiconductor wafer) 150b having not been diced yet as disclosed in Japanese Unexamined Patent Application Publication No. 2006-203215. The semiconductor wafer 150b includes a semiconductor chip region 102b having a plurality of elements formed on a semiconductor substrate (not shown), and a scribe line region 101b surrounding the semiconductor chip region 102b.

In the scribe line region 101b, a metal film 130b and a passivation film 110b are formed on an insulating layer 140 formed of a silicon oxide film. In the passivation film 110b, an endless trench 107b is formed to surround the semiconductor chip region 102b.

To meet recent demand for a chip shrink, the width of the scribe line region has been reduced. As a result, a margin between a dicing-cut surface and an element forming region is reduced, and the damage occurring in the scribe line region during the dicing process is more likely to spread to the semiconductor chip region than before. Accordingly, there is a strong demand for a technique of providing a semiconductor device with high reliability to cope with the reduction in width of the scribe line region.

Japanese Unexamined Patent Application Publication No. 2006-108489 discloses the structure in which the endless trenches 107 and 108 that penetrate the films to reach the surface of the semiconductor substrate 145 are formed, which results in an undesirable increase in etching time when the trenches are formed by etching. Further, there is such a limitation that the metal pattern 130 provided in the scribe line region has to be formed within a region between the trenches 108.

Japanese Unexamined Patent Application Publication No. 2006-140404 discloses means effectively used as a method of preventing a crack from occurring in the sealing ring in the semiconductor device having the low-dielectric-constant films, but does not disclose any method of providing a semiconductor device capable of coping with the reduction in width of the scribe line region.

Japanese Unexamined Patent Application Publication No. 2006-203215 discloses the structure for eliminating a failure caused during a bump forming process, but does not disclose any method of providing a semiconductor device capable of coping with the reduction in width of the scribe line region.

SUMMARY

A first exemplary aspect of an embodiment of the present invention is a semiconductor wafer with a scribe line region and a plurality of element forming regions partitioned by the scribe line region, the semiconductor wafer including: conductive patterns formed into an island shape in the scribe line region; and an island-shaped passivation film formed above at least a conductive pattern, which is or may be exposed to a dicing-cut surface of a semiconductor chip obtained by dicing the semiconductor wafer along the scribe line region, among the conductive patterns, so that the island-shaped passivation film is opposed to the conductive pattern. The phrase "conductive pattern which may be exposed" herein refers to a conductive pattern that may remain on the dicing-cut surface because of limitations of the alignment accuracy during a dicing process.

The semiconductor wafer according to an exemplary embodiment of the present invention includes the island-shaped passivation film formed above the conductive pattern which is or may be exposed to the dicing-cut surface of the semiconductor chip, thereby making it possible to prevent peeling of the conductive pattern exposed when the semiconductor chip is obtained by dicing the semiconductor wafer. As a result, it is possible to prevent occurrence of a short circuit failure due to scattering of the conductive pattern. Furthermore, the passivation film of the scribe line region is formed into an island shape so as to be separated from the passivation film of the element forming region. Accordingly, even when a crack occurs in the passivation film of the scribe line region during the dicing process, the crack can be prevented from spreading to the element forming regions.

A second exemplary aspect of an embodiment of the present invention is a semiconductor device including a semiconductor chip. The semiconductor chip includes: an element forming region formed on a semiconductor substrate; and a frame region formed outside the element forming region. The frame region includes an island-shaped passivation film exposed to a dicing-cut surface. The island-shaped passivation film is separated from a passivation film formed in the element forming region.

A third exemplary aspect of an embodiment of the present invention is a method of manufacturing a semiconductor device including: preparing a semiconductor wafer with a scribe line region and a plurality of element forming regions partitioned by the scribe line region; forming conductive patterns in the scribe line region; forming an island-shaped passivation film above a conductive pattern, which is or may be exposed to a dicing-cut surface of a semiconductor chip when the semiconductor wafer is diced along the scribe line region, among the conductive patterns, so that the island-shaped passivation film is opposed to the conductive pattern; and dicing the semiconductor wafer along the scribe line region to obtain semiconductor chips.

The present invention has excellent effects of providing a semiconductor wafer and a semiconductor device with high reliability.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Hereinafter, exemplary embodiments to which the present invention is applied will be described.

First Exemplary Embodiment

Figure 1:
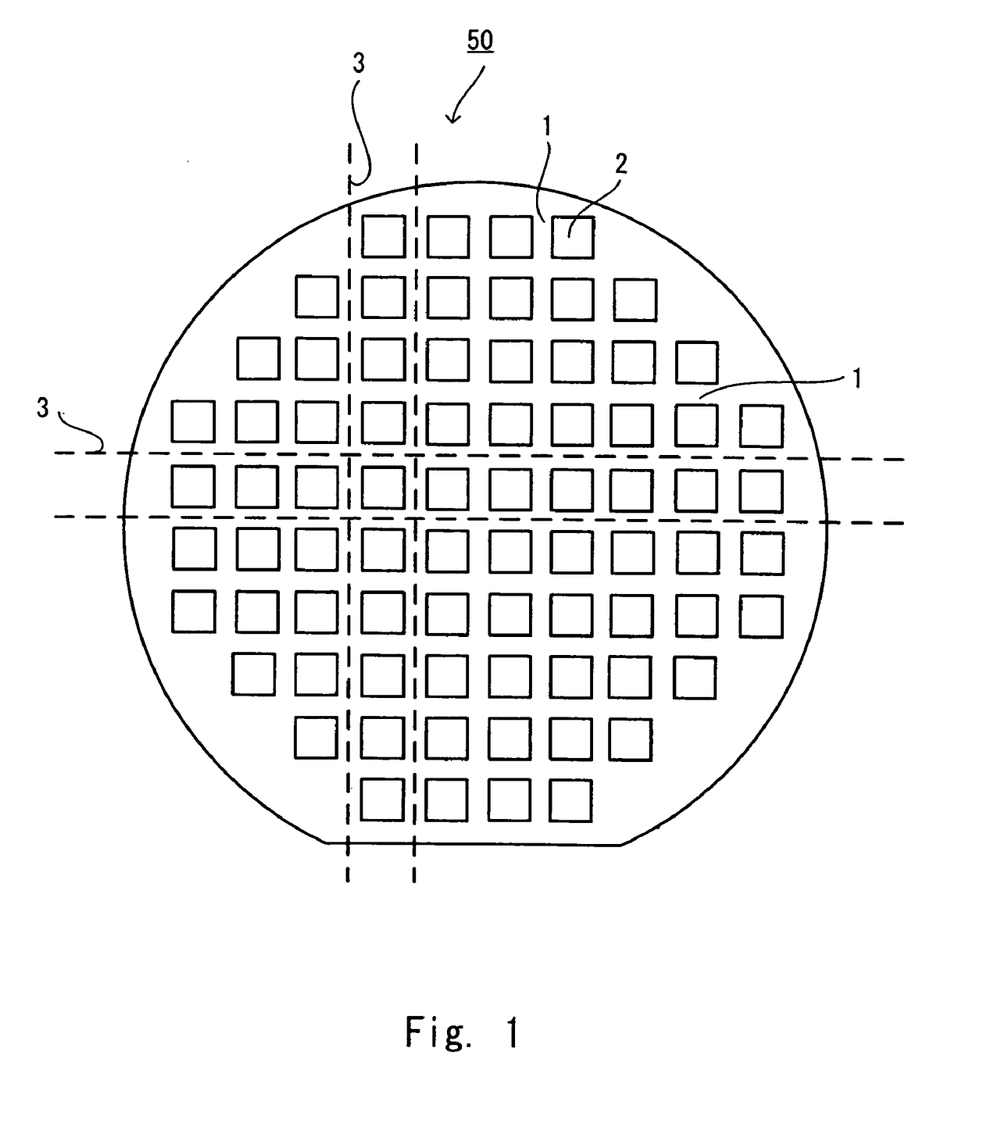
FIG. 1 is a schematic plan view of a semiconductor wafer according to a first exemplary embodiment of the present invention.

FIG. 1 is schematic plan view illustrating a semiconductor wafer 50 according to a first exemplary embodiment of the present invention. As shown in FIG. 1, the semiconductor wafer 50 includes a scribe line region 1 and a plurality of element forming regions 2 partitioned by the scribe line region 1. The element forming regions 2 are regions in each of which elements such as wiring, a transistor, and a resistor are formed, and the element forming regions 2 are aligned vertically and horizontally. Meanwhile, the scribe line region 1 is a region to be diced. The scribe line region 1 is cut along cut lines 3 shown in FIG. 1 so as to divide the element forming regions 2 into individual pieces, thereby obtaining semiconductor chips. Each of the semiconductor chips includes the element forming region 2 and a region that is not cut and remains after the scribe line region 1 is diced (this region is hereinafter referred to as "frame region 5").

Figure 2:
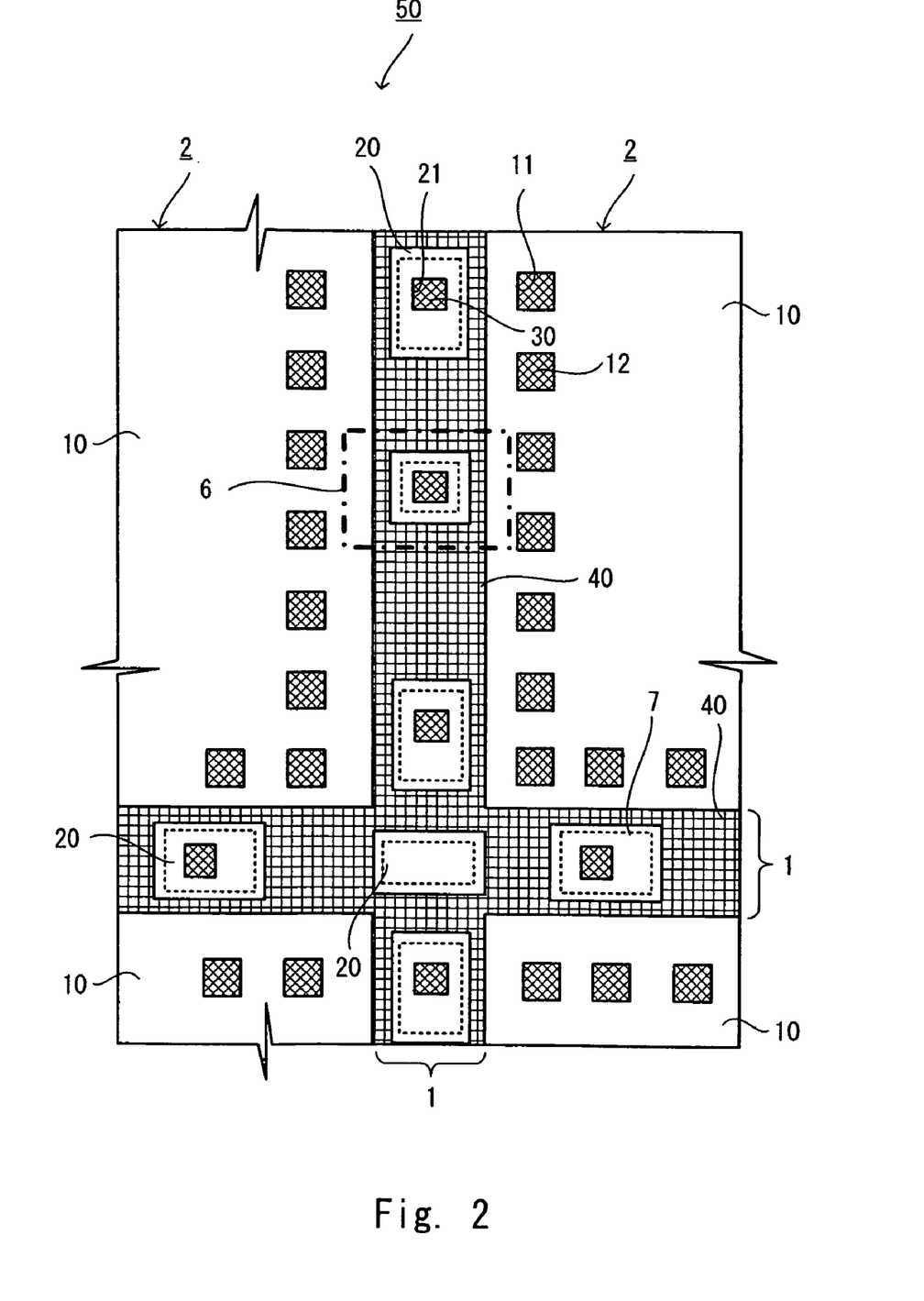
FIG. 2 is a partially enlarged plan view of the semiconductor wafer according to the first exemplary embodiment.

FIG. 2 is a partially enlarged plan view of the semiconductor wafer 50 according to the first exemplary embodiment. The element forming regions 2 are each coated with a passivation film (hereinafter, referred to as "C-passivation film") 10 for protecting the element forming regions 2 of the semiconductor chips. In the vicinity of the outer peripheral part of the C-passivation film 10, a plurality of C-openings 11 are formed.

The C-openings 11 are provided so that an electrode pad 12 which is formed below the C-passivation film 10 and a die pad (not shown) are bonded to each other by the wire.

On an interlayer insulating film 40 formed in the scribe line region 1, a plurality of island-shaped passivation films (hereinafter, referred to as "I-passivation film") 20 are formed. In the interlayer insulating film 40, a via hole (not shown) for electrically connecting layers such as a lower wiring layer formed in the semiconductor substrate and a wiring layer (not shown) serving as an uppermost layer, for example, is formed at a predetermined position. Note that the semiconductor substrate (not shown) includes various elements (not shown) such as the lower wiring layer, transistors, and resistors formed thereon. The term "I-passivation film" refers to an island-shaped film formed in the scribe line region 1, while the "I-passivation film" does not refer to a portion continuously formed from the scribe line region 1 to the element forming region 2 and a portion surrounding the element forming region 2 in the scribe line region 1.

Each of the I-passivation films 20 is opposed to a metal pattern 30 in the thickness direction, with the interlayer insulating film 40 interposed therebetween. Some of the plurality of I-passivation films 20 have an I-opening 21 formed therein. The I-opening 21 is provided so that a probe needle for use in performing a characteristic test on the semiconductor wafer can be brought into contact with the metal pattern 30 formed in the lower layer. Accordingly, it is not necessary to provide the I-opening 21 in a metal pattern (for example, mark for alignment) which need not be brought into contact with the probe needle.

Below the I-passivation film 20, the metal pattern 30 is formed as a conductive pattern in a region 7 indicated by a dashed line in the I-passivation film 20 shown in FIG. 2. The metal pattern 30 is, for example, a metal pattern of a pad for TEG, which is used to acquire manufacturing process data, element data, and the like, or a pattern for alignment, and is formed in the scribe line region 1. One or a plurality of metal patterns 30 are formed below a single I-passivation film 20.

Figure 3:
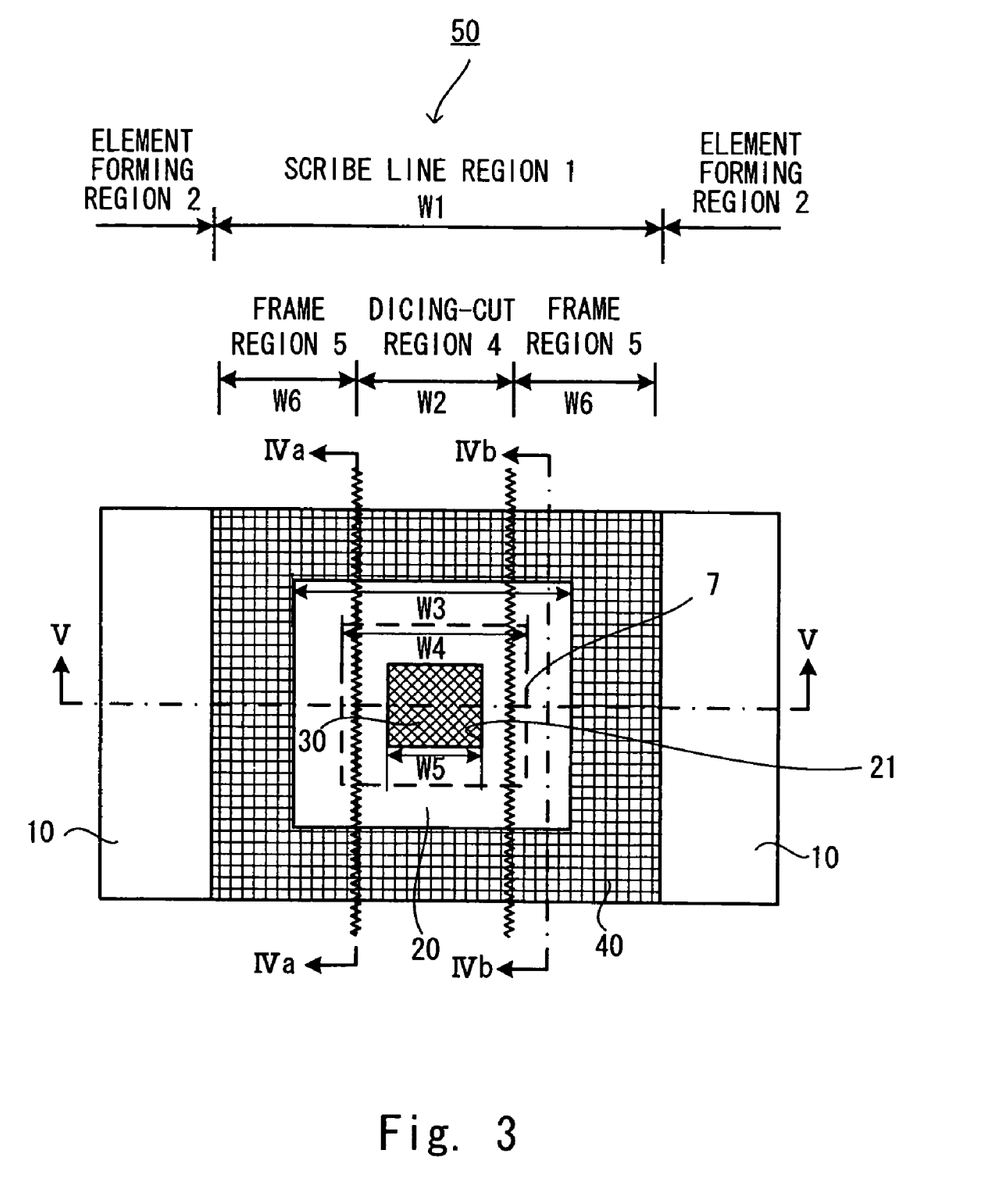
FIG. 3 is a partially enlarged plan view of the semiconductor wafer according to the first exemplary embodiment.
Figure 4A:
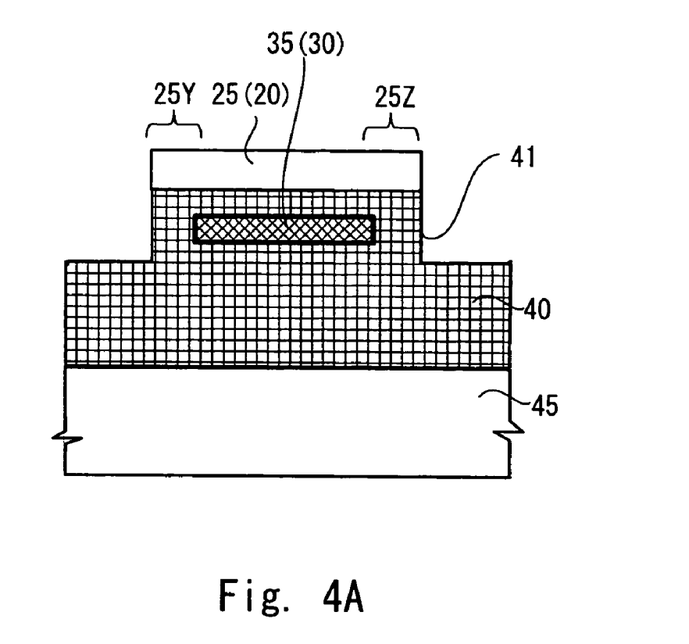
FIG. 4A is a cross-sectional end view taken along the line IVa-IVa of FIG. 3.
Figure 4B:
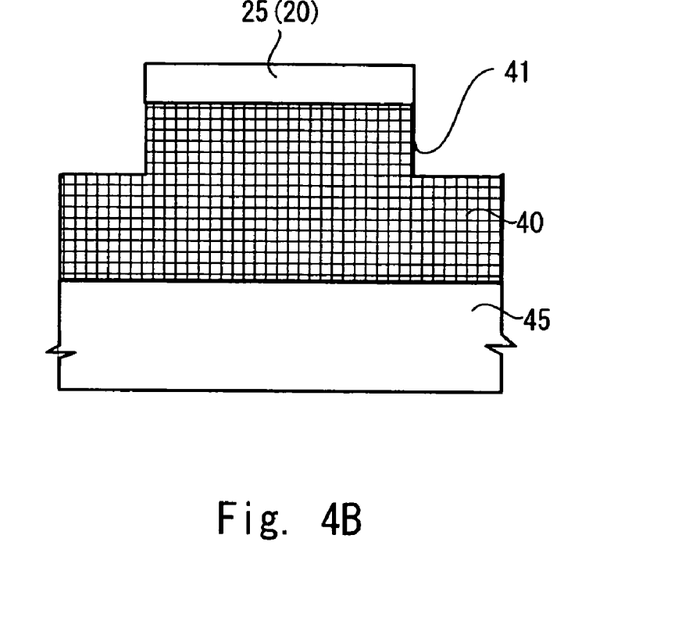
FIG. 4B is a cross-sectional end view taken along the line IVb-IVb of FIG. 3.
Figure 5:
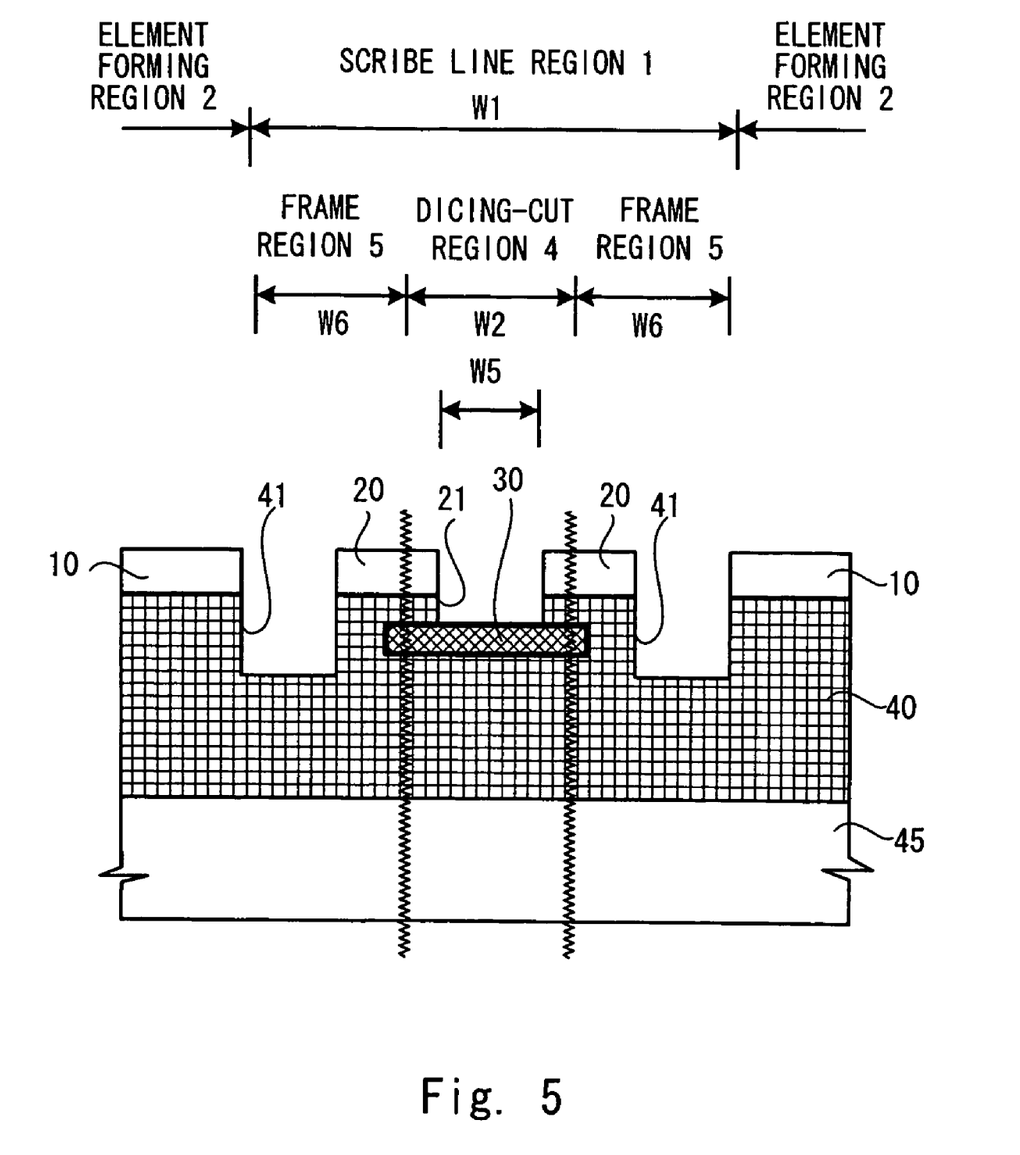
FIG. 5 is a cross-sectional end view taken along the line V-V of FIG. 3.

FIG. 3 shows a partially enlarged plan view of a region surrounded by an alternate long and short dash line 6 of FIG. 2. Further, FIG. 4A is a cross-sectional end view taken along the line IVa-IVa of FIG. 3, which corresponds to the cut surface of each semiconductor chip obtained by dicing the semiconductor wafer. FIG. 4B is a cross-sectional end view taken along the line IVb-IVb of FIG. 3. FIG. 5 is a cross-sectional end view taken along the line V-V of FIG. 3. Furthermore, FIG. 6 is a partially enlarged end view showing semiconductor chips 51 obtained by cutting a dicing-cut region 4 of FIG. 3.

Figure 6:
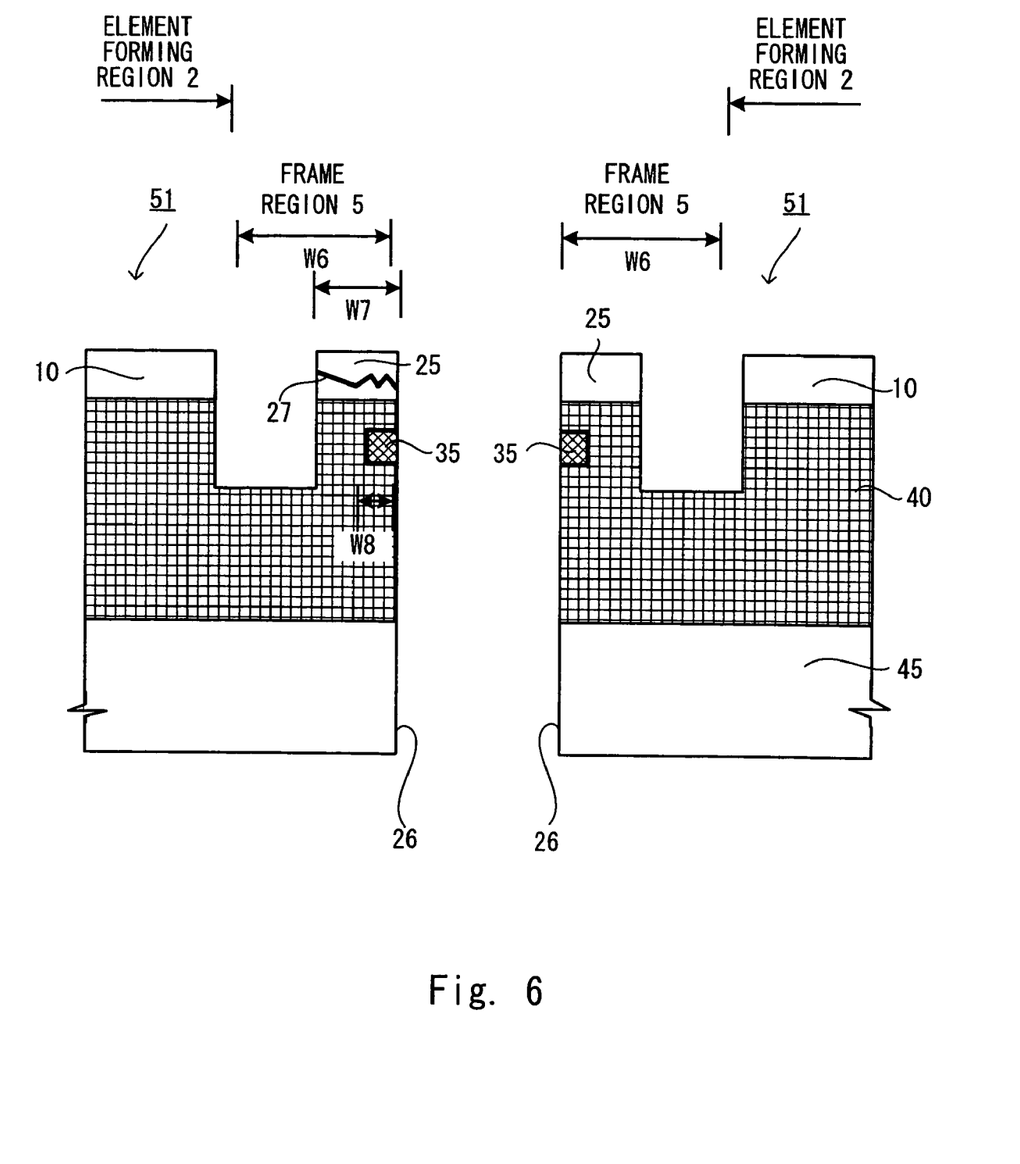
FIG. 6 is a cross-sectional end view showing semiconductor chips obtained after a dicing process.

In the scribe line region 1 of the semiconductor wafer 50, the interlayer insulating film 40 is formed on a semiconductor substrate 45 (see FIGS. 4 to 6). Further, the metal pattern 30 having an island shape is formed within the interlayer insulating film 40. Furthermore, the I-passivation films 20 each having an island shape are formed on the interlayer insulating film 40. In the scribe line region 1, the I-passivation films 20 are formed in a predetermined region on the interlayer insulating film 40. According to the first exemplary embodiment, the exposed portions of the interlayer insulating film 40, on which the I-passivation films 20 are not formed, correspond to regions, each of which has an recess 41 formed in the interlayer insulating film 40, as shown in FIG. 5. This structure more effectively prevents damage occurring during the dicing process from spreading to the element forming regions 2.

In this case, it is assumed that the width of the scribe line region 1 is set as W1; the width of the dicing-cut region 4 is set as W2; the width of the I-passivation film 20 is set as W3; the width of the metal pattern 30 formed in the lower layer is set as W4; and the width of the I-opening 21 is set as W5. Note that the width herein refers to the length in the short axis direction of the scribe line region 1. The semiconductor wafer according to the first exemplary embodiment is structured so that a relation W1>W3>W4>W2>W5 is satisfied.

The region to be diced is located near the central portion of the scribe line region 1. In light of the alignment accuracy of a cutting edge of a blade for use in the dicing process, the frame region 5 is formed on both sides of the scribe line region 1 in the short axis direction so as to prevent the element forming regions 2 from being cut. Each of the semiconductor chips 51, which are separated when the semiconductor wafer 50 is diced along the scribe line region 1, includes the element forming region 2 and the frame region 5. In other words, assuming that the width of the frame region 5 is set as W6, a relation W1=W2+2W6 is satisfied.

The width W2 of the dicing-cut region 4 is smaller than the width W3 of the I-passivation film 20, and the central region of the I-passivation film 20 is cut off in the dicing process. In each of the semiconductor chips 51, which are separated in the dicing process, both of the cut sides of the central region of the I-passivation film 20 are exposed to side surfaces of different semiconductor chips 51. Assuming that the passivation film remaining on each of the semiconductor chips 51 is referred to as an S-passivation film 25 (see FIG. 6) and the width of the S-passivation film 25 is set as W7, a relation W3=2W7+W2 is satisfied. Note that the width W7 of the S-passivation film 25, which is obtained from the I-passivation film 20, is not necessarily uniform at a pair of opposed portions. Even when the width W7 is set to be uniform, the width may vary because of limitations of the alignment accuracy during the dicing process.

Further, according to the first exemplary embodiment, the width W2 of the dicing-cut region 4 is smaller than the width W4 of the metal pattern 30, and the central region of the metal pattern 30 is cut off during the dicing process. In each of the semiconductor chips 51, which are separated in the dicing process, the cut surfaces of the metal pattern 30 are exposed to side surfaces of different semiconductor chips. Assuming that the metal pattern exposed to the side surface of the semiconductor chip is referred to as an S-metal pattern 35 (see FIG. 6) and the width of the S-metal pattern in the short axis direction of the scribe line region is set as W8, a relation W4=2W8+W2 is satisfied. Note that the width W8 of the S-metal pattern 35, which is obtained from the metal pattern 30, is not necessary uniform at a pair of opposed portions. Even when the width W8 is set to be uniform, the width may vary because of limitations of the alignment accuracy during the dicing process.

The width W2 of the dicing-cut region 4 is set to be greater than the width W5 of the I-opening 21 formed in the I-passivation film 20. Further, a dicing-cut surface 26, which is a cut surface obtained by the dicing process, is provided so as not to overlap a region in which the I-opening 21 is formed. This is because the upper layer of the metal pattern which is or may be exposed to the dicing-cut surface is protected by the passivation film.

The I-passivation film 20 is formed to be opposed to (overlap) the S-metal pattern 35, which is exposed to the dicing-cut surface 26 (see FIG. 6) that is the side surface of the semiconductor chip obtained when the semiconductor wafer 50 is diced along the scribe line region 1, with the interlayer insulating film 40 interposed therebetween (see FIG. 4A). At the dicing-cut surface 26, the S-passivation film 25 has non-opposed regions (first non-opposed region 25Y and second non-opposed region 25Z), which are not opposed to the S-metal pattern 35, at both ends of the S-passivation film 25 in side view.

In each of the semiconductor chips 51, it is not always necessary to form the S-metal pattern 35 at the dicing-cut surface 26. That is, the semiconductor chip 51 may have a structure in which the metal pattern 30 is formed within the width W2 of the dicing-cut region 4. Alternatively, the semiconductor chip 51 may have a structure in which the metal pattern 35 is not formed at the dicing-cut surface 26 of the semiconductor chip. Note that, to meet recent demand for a chip shrink, the width of the scribe line region has been reduced, with the result that the metal pattern covers the major part of the scribe line region in the width direction.

It is preferable to narrow the scribe line region 1 in terms of a chip shrink, and it is also preferable to reduce the width of the dicing-cut region 4 as much as possible. This is because, when the ratio of the dicing-cut region 4 to the scribe line region 1 is set to be large, the semiconductor chip is more susceptible to cracking and chipping caused during the dicing process. Accordingly, the width W4 of the metal pattern 30 is set to be greater than the width W2 of the dicing-cut region 4 in many cases.

At the dicing-cut surface 26, the S-passivation film 25 of the semiconductor chip is formed to be opposed to the S-metal pattern 35. Thus, even in the structure in which the S-metal pattern 35 remains in the frame region 5 of the semiconductor chip 51, it is possible to prevent the occurrence of a short circuit between pads due to peeling of the S-metal pattern 35. It is also possible to prevent the occurrence of a failure of a bonding wire and inner lead bonding (ILB) of tape automated bonding (TAB) due to scattering of metal chippings from the S-metal pattern 35.

Even if a crack 27 as shown in FIG. 6 occurs during the dicing process for the S-passivation film 25, the crack can be prevented from spreading to the element forming region 2, since the S-passivation film 25 is separated from the C-passivation film 10 formed in the element forming region 2. Therefore, it is possible to provide a semiconductor wafer and a semiconductor chip with high reliability, and a semiconductor device having the semiconductor chip mounted thereon.

Even if the dicing cut line deviates into the region which has the recess 41 formed therein and which is a region outside the I-passivation film 20, there is no possibility that the metal pattern 30 is exposed to the dicing-cut surface. This is because the metal pattern 30 is not formed in the region in which the recess 41 is formed. Accordingly, a wide manufacturing margin can be obtained.

Further, according to the first exemplary embodiment, as shown in FIG. 4A, at the dicing-cut surface 26 of the semiconductor chip, the S-passivation film 25 has non-opposed regions that are not opposed to the S-metal pattern 35 in side view. The exposed region of the S-metal pattern 35 is formed only at the dicing-cut surface 26 of the semiconductor chip, thereby more effectively preventing scattering of metal chippings. Further, even when misalignment occurs because of limitations of the alignment accuracy required in the manufacturing process, for example, it is possible to suppress the formation of the S-metal pattern 35 that is not protected by the S-passivation film 35. As a result, the manufacturing margin can be improved.

According to the first exemplary embodiment, the metal pattern 30 formed in the interlayer insulating film 40 has been described by way of example, but the structure of the metal pattern 30 is not limited thereto. For example, the metal pattern 30 may be in direct contact with the I-passivation film 20, that is, the I-passivation film 20 may be formed immediately above the metal pattern 30. Further, the metal pattern 30 is not limited to a single-layer pattern, but may be a stacked body of a plurality of layers. Alternatively, the metal pattern 30 may be made of any material other than metal, as long as the metal pattern 30 is a conductive pattern. Furthermore, according to the first exemplary embodiment, the metal pattern 30 having a single layer structure has been described by way of example, but the metal pattern may be formed of a plurality of metal layers and a via hole for connecting these layers in a semiconductor chip having a multilayer wiring structure, for example.

Second Exemplary Embodiment

Next, a description is given of an example of a semiconductor wafer different from of the semiconductor wafer according to the first exemplary embodiment. Hereinafter, the same components and members as those of the first exemplary embodiment are denoted by the same reference numerals, and a description thereof is omitted as appropriate.

The basic structure of a semiconductor wafer according to a second exemplary embodiment of the present invention is the same as the structure of the semiconductor wafer according to the first exemplary embodiment, except for the following points. That is, in the semiconductor wafer according to the first exemplary embodiment, the width W4 of the metal pattern 30 is greater than the width W2 of the dicing-cut region 4 and the S-metal pattern 30 is formed to be exposed to the side surface of the semiconductor chip 51 obtained after the dicing process, while in the semiconductor wafer according to the second exemplary embodiment, the width W4 of a metal pattern 30a is smaller than the width W2 of the dicing-cut region 4 and the metal pattern 30a is formed within the dicing-cut region 4. In other words, the semiconductor wafer according to the second exemplary embodiment has a structure in which the metal pattern is cut off during the dicing process and the metal pattern does not remain in the semiconductor chip.

Figure 7:
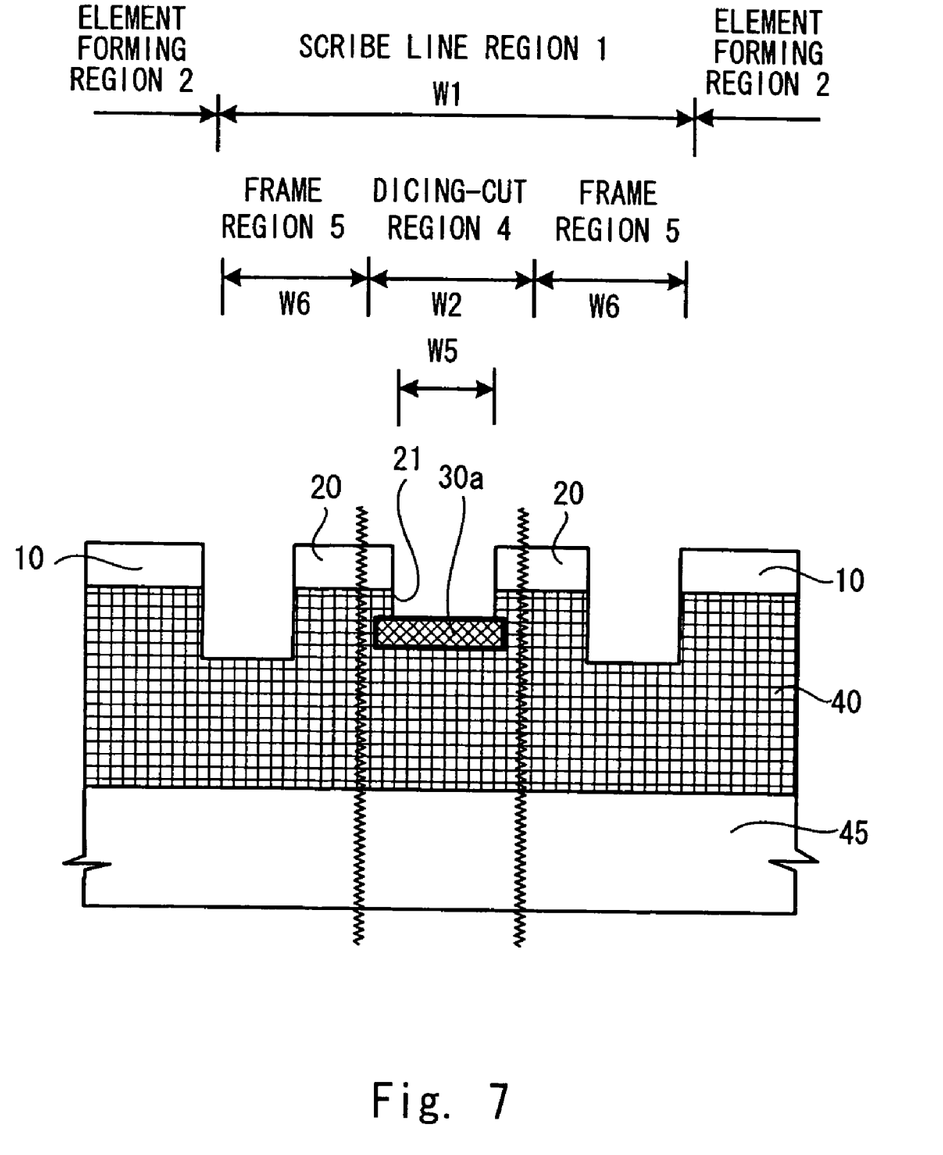
FIG. 7 is a cross-sectional end view of a semiconductor wafer according to a second exemplary embodiment of the present invention.

FIG. 7 shows a cross-sectional end view of the semiconductor wafer according to the second exemplary embodiment. The semiconductor wafer according to the second exemplary embodiment is structured so that a relation W1>W3>W2>W4>W5 is satisfied. That is, as described above, the width W4 of the metal pattern 30a is smaller than the width W2 of the dicing-cut region 4 and the metal pattern 30a is formed within the dicing-cut region 4. Accordingly, as shown in FIG. 4B, the metal pattern is not exposed to the side surface of the semiconductor chip obtained after the dicing process.

In the dicing process for the semiconductor wafer, it is necessary to set a margin of the dicing-cut region 4 in light of the limitations of the alignment accuracy for the dicing-cut region 4 and the manufacturing margin. According to the second exemplary embodiment, the I-passivation film 20 having a size larger than the metal pattern 30a is formed above the metal pattern 30a that is formed within the scribe line region 1. Accordingly, even when the metal pattern 30a remains on the side of the semiconductor chip because of the limitations of the alignment accuracy during the dicing process, the S-passivation film 25 is formed above the metal pattern 30a. Thus, even when the metal pattern 35 remains in the semiconductor chip, it is possible to prevent the occurrence of a short circuit between pads due to peeling of the metal pattern and the occurrence of a failure in forming a bonding wire due to scattering of metal chippings. As a result, it is not necessary to set the width of the margin to be wide enough for the metal pattern in light of the alignment accuracy for the dicing-cut region. This is advantageous in realizing a reduction in width of the scribe line.

Third Exemplary Embodiment

The basic structure of a semiconductor wafer according to a third exemplary embodiment of the present invention is the same as the structure of the semiconductor wafer according to the first exemplary embodiment, except for the following points. That is, in the semiconductor wafer according to the first exemplary embodiment, the width W4 of the metal pattern 30 is smaller than the width W3 of the I-passivation film 20 and the metal pattern 30 is formed in the I-passivation film 20, while in the semiconductor wafer according to the third exemplary embodiment, the width W4 of a metal pattern 30b is greater than the width W3 of the I-passivation film 20 and non-opposed regions that are not opposed to the I-passivation film 20 are present in the width direction of the scribe line region 1. Further, the interlayer insulating film 40 according to the first exemplary embodiment has recesses formed therein, in side view, in the regions in which the I-passivation film 20 is not formed, while an interlayer insulating film 40b according to the third exemplary embodiment has no recess, in side view, also in the regions in which the I-passivation film 20 is not formed.

According to Japanese Unexamined Patent Application Publication No. 2006-108489, it is necessary to form the metal pattern inside the trenches 107 and 108 that reach the semiconductor substrate 145. Likewise, according to Japanese Unexamined Patent Application Publication No. 2006-203215, it is impossible to form the metal pattern having a width greater than that of the passivation film 110b. According to the third exemplary embodiment, it is possible to form the metal pattern having a width greater than that of the passivation film.

Figure 8:
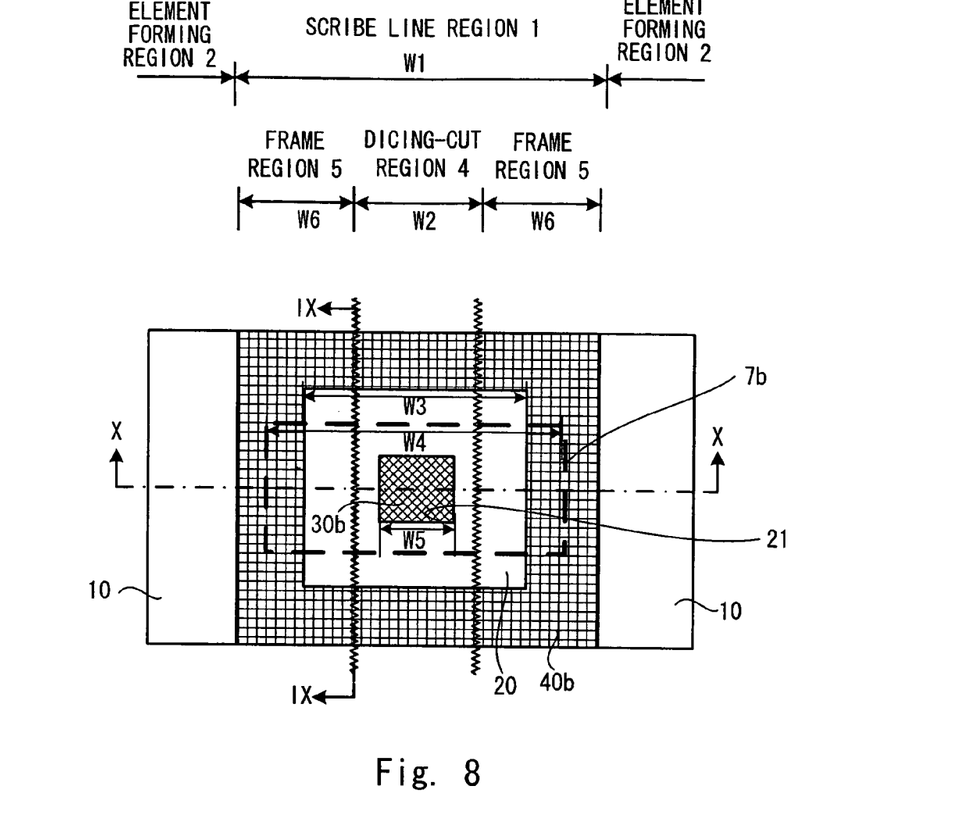
FIG. 8 is a partially enlarged plan view of a semiconductor wafer according to a third exemplary embodiment of the present invention.

FIG. 8 shows a partially enlarged plan view of the semiconductor wafer according to the third exemplary embodiment at a position corresponding to that of FIG. 3 according to the first exemplary embodiment. Further, FIG. 9 shows a cross-sectional end view taken along the line IX-IX of FIG. 8, and FIG. 10 shows a cross-sectional end view taken along the line X-X of FIG. 8.

As shown in FIG. 8, the semiconductor wafer according to the third exemplary embodiment is structured so that a relation W1>W4>W3>W2>W5 is satisfied. The metal pattern 30b is formed in a region indicated by a dashed line 7b of FIG. 8. More specifically, as described above, the width W4 of the metal pattern 30b is greater than the width W3 of the I-passivation film 20, and the metal pattern 30b is formed in the width direction of the scribe line region 1 so that non-opposed regions 28 (see FIG. 10) that are not opposed to the I-passivation film 20 are present. According to the third exemplary embodiment, the dicing-cut region is set to be positioned above the I-passivation film 20.

Figure 9:
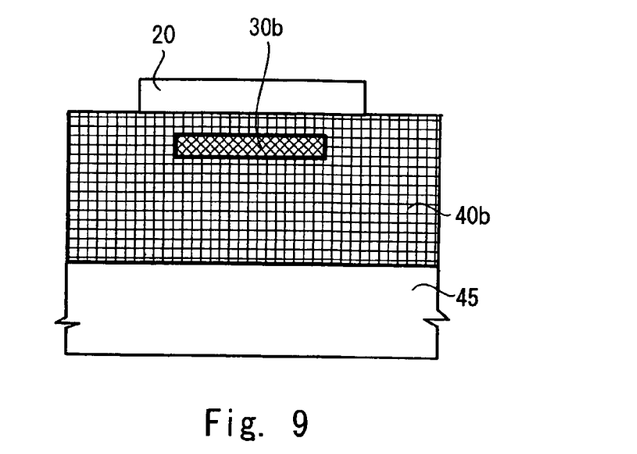
FIG. 9 is a cross-sectional end view taken along the line IX-IX of FIG. 8.
Figure 10:
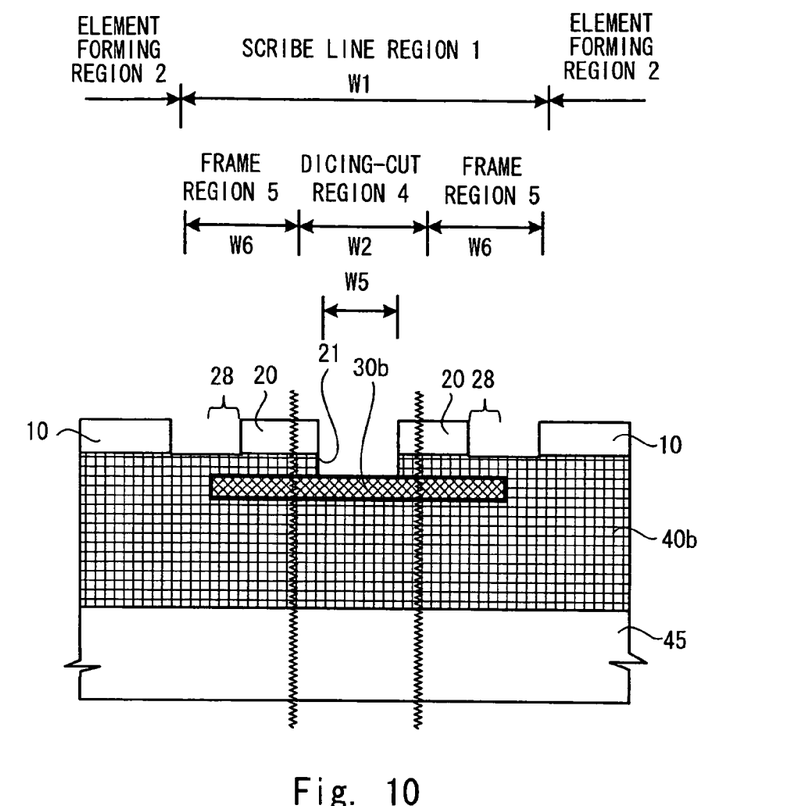
FIG. 10 is a cross-sectional end view taken along the line X-X of FIG. 8.

As shown in FIGS. 9 and 10, the interlayer insulating film 40b according to the third exemplary embodiment has no recess in the regions in which the I-passivation film 20 is not stacked, unlike the first exemplary embodiment. Since the S-metal pattern 30b is coated with the interlayer insulating film 40b even in the case where the width W4 of the metal pattern 30b is greater than the width W3 of the I-passivation film 20, there is no region in which the S-metal pattern 30b is exposed, in plan view, in the frame region 5 of the semiconductor chip. Meanwhile, at the dicing-cut surface 26 of the semiconductor chip, the S-passivation film 25 is formed above the metal pattern.

The third exemplary embodiment is effective particularly when the width W4 of the metal pattern 30b is set to a large value. That is, it is possible to prevent the occurrence of a short circuit between pads due to peeling of the S-metal pattern 35 remaining in the frame region of the semiconductor chip and the occurrence of a failure of a bonding wire due to scattering of metal chippings, for example, while realizing a reduction in width of the scribe line region without increasing the width W2 of the dicing region 2 in accordance with the width W4 of the metal pattern 30b.

Further, even when a crack occurs in the S-passivation film 25 during the dicing process, the crack can be prevented from spreading to the element forming region 2, since the S-passivation film 25 is separated from the C-passivation film 10 formed in the element forming region 2. Furthermore, according to the third exemplary embodiment, patterning of the interlayer insulating film of the scribe line region in correspondence with the passivation film is not carried out, which is advantageous in reducing an etching time, for example.

Fourth Exemplary Embodiment

The basic structure of a semiconductor wafer according to a fourth exemplary embodiment of the present invention is the same as the structure of the semiconductor wafer according to the first exemplary embodiment, except for the following points. That is, in the semiconductor wafer according to the first exemplary embodiment, the S-passivation film 25 has the non-opposed regions (first non-opposed region 25Y and second non-opposed region 25Z) that are not opposed to the S-metal pattern 35 at both ends of the S-passivation film 25 at the dicing-cut surface, in side view, while in the semiconductor wafer according to the fourth exemplary embodiment, an S-passivation film 25c has no non-opposed region that is not opposed to the S-metal pattern 35.

Figure 11:
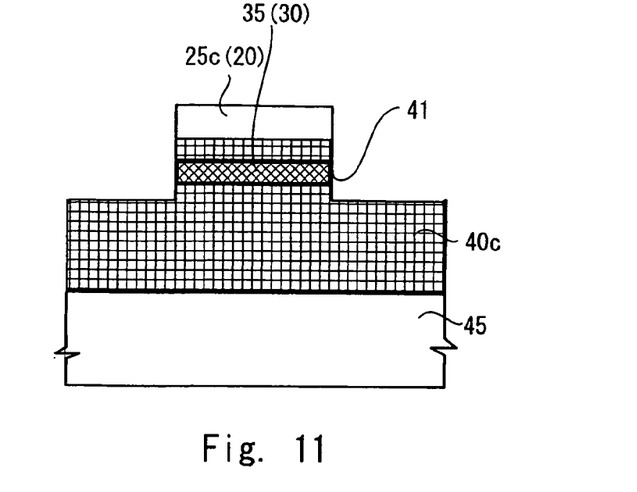
FIG. 11 is a cross-sectional view of a semiconductor wafer according to a fourth exemplary embodiment of the present invention.

FIG. 11 is a diagram showing the semiconductor wafer according to the fourth exemplary embodiment, which corresponds to a cross-sectional end view taken along the line IVa-IVa of FIG. 3. That is, FIG. 11 shows an end view of the dicing-cut surface of the semiconductor chip. As for the I-passivation film 20, when the semiconductor wafer 50 is diced along the scribe line region, the S-passivation film 25c, which has substantially the same width as that of the S-metal pattern 35 at the dicing-cut surface 26, is opposed to (overlaps) the S-metal pattern 35 with an interlayer insulating film 40c interposed therebetween (see FIG. 11).

According to the fourth exemplary embodiment, since an island-shaped passivation film is formed above the conductive pattern exposed to the side surface of the semiconductor chip, it is possible to prevent peeling of the conductive pattern exposed when semiconductor chips are obtained by dicing the semiconductor wafer. As a result, it is possible to prevent the occurrence of a short-circuit failure due to scattering of the conductive pattern. Further, the passivation film is formed into an island shape on the scribe line region, to thereby separate the passivation film from the element forming region. As a result, even when a crack occurs in the passivation film of the scribe line region during the dicing process, it is possible to prevent the crack from spreading to the element forming region.

Note that, according to an exemplary embodiment of the present invention, a crack (cover crack) occurring in the passivation film can be prevented from spreading to the element forming region 2 without being limited to the structure of the interlayer insulating film. Further, according to an exemplary embodiment of the present invention, scattering of metal chippings generated when the metal pattern is diced is effectively prevented without being limited to the structure of the interlayer insulating film. Furthermore, a bump or the like may be stacked on the passivation film, and various modifications can be made without departing from the spirit and scope of the present invention.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor wafer with a scribe line region and a plurality of element forming regions partitioned by the scribe line region, the semiconductor wafer comprising:
   conductive patterns formed in the scribe line region; and
   an island-shaped passivation film formed above at least a conductive pattern, wherein the conductive pattern is or may be exposed to a dicing-cut surface of a semiconductor chip obtained by dicing the semiconductor wafer along the scribe line region, among the conductive patterns, so that the island-shaped passivation film is opposed to the conductive pattern.

2. The semiconductor wafer according to claim 1, wherein the island-shaped passivation film includes, at both ends thereof, regions being not opposed to the conductive pattern in side view.

3. The semiconductor wafer according to claim 1, wherein the island-shaped passivation film has an opening formed therein to penetrate the island-shaped passivation film and reach the conductive pattern.

4. The semiconductor wafer according to claim 2, wherein the island-shaped passivation film has an opening formed therein to penetrate the island-shaped passivation film and reach the conductive pattern.

5. The semiconductor wafer according to claim 1, wherein the conductive pattern comprises a metal pattern.

6. A semiconductor device comprising a semiconductor chip, wherein:
   the semiconductor chip comprises:
      an element forming region formed on a semiconductor substrate; and
      a frame region formed outside the element forming region on the semiconductor substrate;
   the frame region includes an island-shaped passivation film exposed to a dicing-cut surface; and
   the island-shaped passivation film is separated from a passivation film formed in the element forming region.

7. The semiconductor device according to claim 6, further comprising a conductive pattern exposed to the dicing-cut surface and formed below the island-shaped passivation film exposed to the dicing-cut surface,
   wherein the conductive pattern is formed to be opposed to the island-shaped passivation film at the dicing-cut surface.

8. The semiconductor device according to claim 7, wherein the island-shaped passivation film include, at both ends thereof, regions being not opposed to the conductive pattern in side view.

9. The semiconductor device according to claim 6, wherein an interlayer insulating film is exposed in a region being not coated with the island-shaped passivation film of the frame region.

10. The semiconductor device according to claim 7, wherein an interlayer insulating film is exposed in a region being not coated with the island-shaped passivation film of the frame region.

11. The semiconductor device according to claim 8, wherein an interlayer insulating film is exposed in a region being not coated with the island-shaped passivation film of the frame region.

12. The semiconductor device according to claim 9, wherein the interlayer insulating film exposed in the region of the frame region comprises a bottom surface of a recess formed in the interlayer insulating film, the region being not coated with the island-shaped passivation films.

13. The semiconductor wafer according to claim 1, further comprising a recess separating an element forming region from the scribe line region.

14. The semiconductor wafer according to claim 1, wherein a width of a dice-cutting region is smaller than a width of the conductive pattern.

15. The semiconductor wafer according to claim 1, further comprising an opening formed above the conductive pattern.

* * * * *